United States Patent
Sugihara

(10) Patent No.: US 11,122,719 B2
(45) Date of Patent: Sep. 14, 2021

(54) COMPONENT MOUNTER

(71) Applicant: FUJI CORPORATION, Chiryu (JP)

(72) Inventor: Kohei Sugihara, Nishio (JP)

(73) Assignee: FUJI CORPORATION, Chiryu (JP)

( * ) Notice: Subject to any disclaimer, the term of this patent is extended or adjusted under 35 U.S.C. 154(b) by 218 days.

(21) Appl. No.: 16/334,554

(22) PCT Filed: Sep. 21, 2016

(86) PCT No.: PCT/JP2016/077851
§ 371 (c)(1),
(2) Date: Mar. 19, 2019

(87) PCT Pub. No.: WO2018/055697
PCT Pub. Date: Mar. 29, 2018

(65) Prior Publication Data
US 2020/0084926 A1    Mar. 12, 2020

(51) Int. Cl.
*H05K 13/04* (2006.01)
*H05K 13/08* (2006.01)

(52) U.S. Cl.
CPC ....... *H05K 13/0406* (2018.08); *H05K 13/041* (2018.08); *H05K 13/0409* (2018.08); *H05K 13/0413* (2013.01); *H05K 13/082* (2018.08)

(58) Field of Classification Search
CPC ........... H05K 13/0812; H05K 13/0813; H05K 13/028; H05K 13/044–0413; B25J 9/1697; G05B 2219/37572; G05B 2219/50
See application file for complete search history.

(56) References Cited

U.S. PATENT DOCUMENTS

2015/0282398 A1 * 10/2015 Kawaguchi ........ H05K 13/0406
29/740

FOREIGN PATENT DOCUMENTS

| EP | 2 925 109 A1 | 9/2015 |
| EP | 2 981 163 A1 | 2/2016 |
| EP | 3 061 331 | 8/2016 |
| JP | 2002-43336 A | 2/2002 |

(Continued)

OTHER PUBLICATIONS

International Search Report dated Dec. 13, 2016 in PCT/JP2016/077851 filed on Sep. 21, 2016.

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

A component mounter provided with a first raising and lowering device to raise and lower a raising and lowering member, and a second raising and lowering device to relatively raise a suction nozzle with respect to the raising and lowering member. The component mounter performs, among multiple types of operations of lowering the suction nozzle, a cleaning operation of cleaning the suction nozzle and a discarding operation of discarding a component for which an error occurred via a first operation mode of lowering the suction nozzle by driving the first raising and lowering device. Also, the component mounter performs pickup operation of picking up the component and mounting operation of mounting the component via a second operation mode of lowering the suction nozzle by driving the first raising and lowering device and the second raising and lowering device.

5 Claims, 11 Drawing Sheets

(56) References Cited

FOREIGN PATENT DOCUMENTS

| KR | 20100059659 A | * | 6/2010 | ............... B08B 5/00 |
| WO | WO-2009028713 A1 | * | 3/2009 | ......... H05K 13/0812 |
| WO | WO 2014/080472 A1 | | 5/2014 | |
| WO | WO-2014080472 A1 | * | 5/2014 | ......... H05K 13/0413 |
| WO | WO 2016/129151 A1 | | 8/2016 | |

* cited by examiner

COMPONENT MOUNTER

TECHNICAL FIELD

The present application relates to a component mounter.

BACKGROUND ART

Conventionally, there is a known component mounter (for example, patent literature 1) provided with a head main body, a holding member (suction nozzle) that holds an electronic component, a first raising and lowering drive device for raising and lowering a raising and lowering member with respect to the head main body, and a second raising and lowering drive device for relatively raising and lowering the holding member with respect to the raising and lowering member while being raised and lowered together with the raising and lowering member by the first raising and lowering drive device. The second raising and lowering drive device, when a component supplied by a component supply device is picked up by the holding member and when the held component is mounted on a board, first, lowers the holding member using the first raising and lowering drive device, then lowers the holding member using the second raising and lowering drive device, such that the holding member contacts the component, or such that the component held by the holding member contacts the board.

CITATION LIST

Patent Literature

Patent literature 1: WO2014/80472A1

BRIEF SUMMARY

Technical Problem

However, because such two-stage raising and lowering control of the holding member leads to longer operation, it cannot be considered to be always efficient when applied to various operations performed in accordance with the lowering of a holding member by a component mounter.

A main object of the present disclosure is to appropriately perform multiple types of operations in accordance with the lowering of a holding member.

Solution to Problem

The present disclosure uses the following means to achieve the above object.

A component mounter of the present disclosure is for picking up a component supplied by a component supply device and mounting the component on a target object, the component mounter including: head; a holding member configured to hold a component; a first raising and lowering device configured to raise and lower a raising and lowering member with respect to the head; a second raising and lowering device configured to relatively raise and lower the holding member with respect to the raising and lowering member and to be raised and lowered together with the raising and lowering member by the first raising and lowering device; and a control device configured to selectively perform a first operation mode of driving the first raising and lowering device to lower the holding member, and a second operation mode of driving the first raising and lowering device and the second raising and lowering device to lower the holding member.

A component mounter of the present disclosure is provided with a first raising and lowering device configured to raise and lower a raising and lowering member with respect to the head; and a second raising and lowering device configured to relatively raise and lower the holding member with respect to the raising and lowering member and to be raised and lowered together with the raising and lowering member by the first raising and lowering device. The component mounter selectively performs a first operation mode of driving the first raising and lowering device to lower the holding member, and a second operation mode of driving the first raising and lowering device and the second raising and lowering device to lower the holding member. Thus, with the component mounter, by appropriately using either the first operation mode or the second operation mode for multiple types of operations in accordance with the lowering of the holding member, it is possible to appropriately perform the multiple types of operations.

A component mounter of the present disclosure may further include a load measuring section provided on the second raising and lowering device and configured to measure a load applied with respect to the holding member, and the control device may perform an operation that does not require the load measuring section via the first operation mode, and perform an operation that requires the load measuring section via the second operation mode. Accordingly, while it is possible to perform operations that require the load measuring section with high accuracy via the second operation mode, it is possible to perform operation that do not require the load measuring section with high speed via the first operation mode.

Also, with a component mounter of the present disclosure, the control device may be configured to perform a rejection operation of rejecting a component picked up by the holding member via the first operation mode. Also, the control device may be configured to perform a rejection operation of rejecting a component picked up by the holding member via the first operation mode in a case in which a type of the component is a non-specified type, and perform the rejection operation of rejecting the component picked up by the holding member via the second operation mode in a case in which the type of the component is a specified type.

Further, with a component mounter of the present disclosure, the control device may be configured to perform a cleaning operation of cleaning the holding member via the first operation mode.

Also, with a component mounter of the present disclosure, the control device may be configured to perform a mounting operation of using the holding member to mount the component via the second operation mode.

Also, with a component mounter of the present disclosure, the control device may be configured to perform a pickup operation of using the holding member to pick up the component via the second operation mode.

DESCRIPTION OF EMBODIMENTS

Embodiments of the present disclosure are described below with reference to the drawings.

Figure 1:
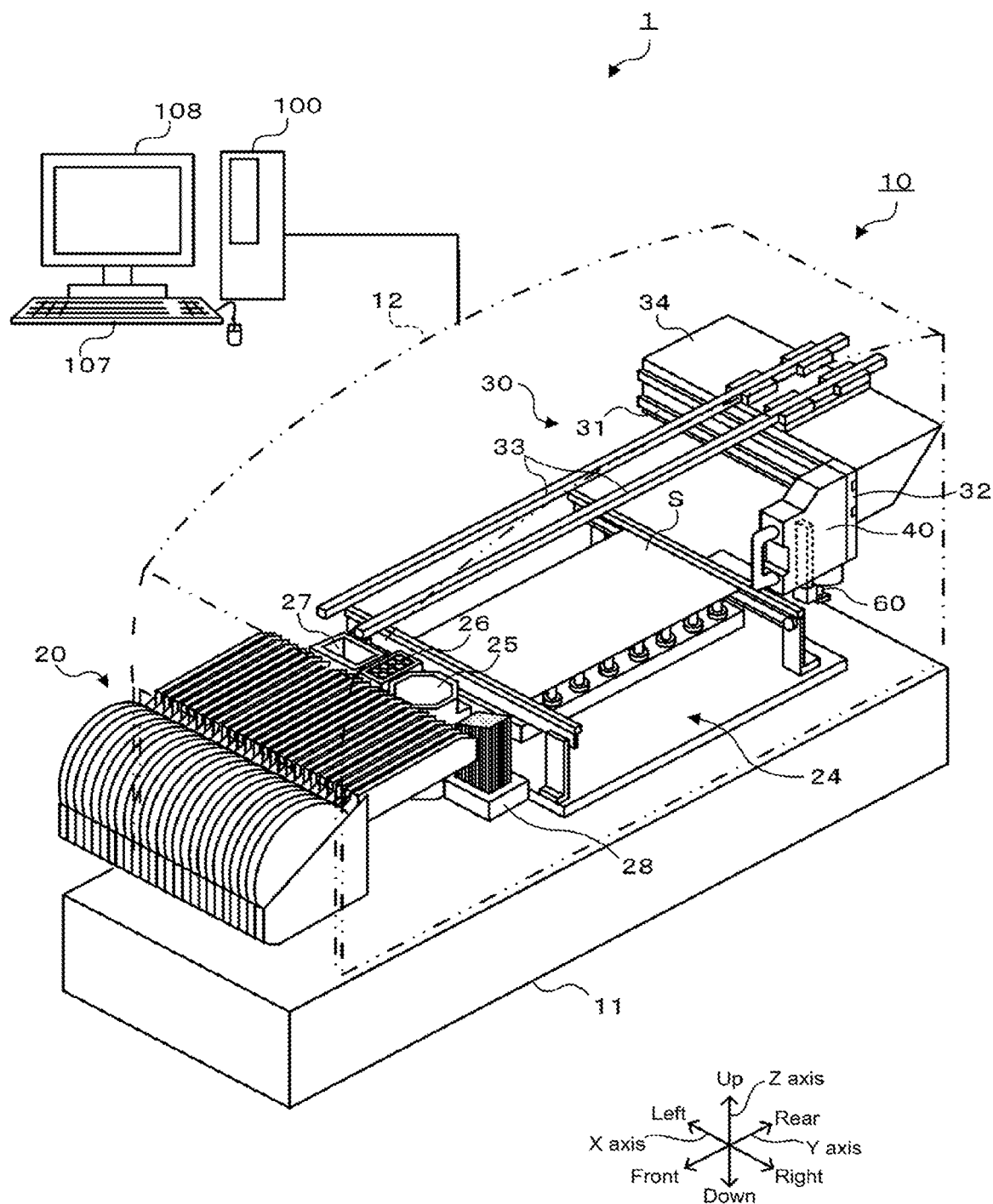
FIG. 1 shows an outline of the configuration of component mounting system 1 that includes component mounter 10 of an embodiment.
Figure 2:
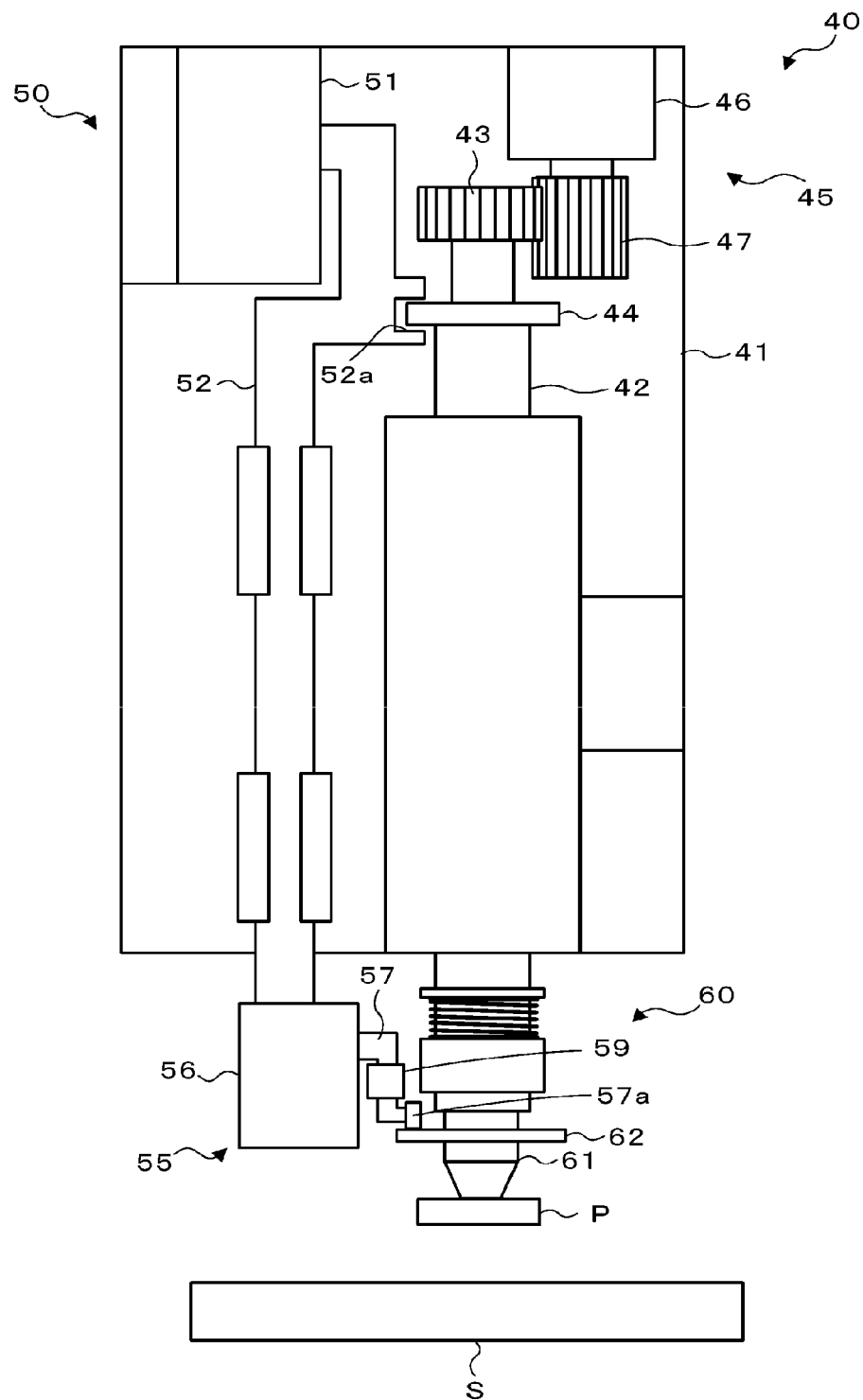
FIG. 2 shows an outline of the configuration of mounting head 40.
Figure 3:
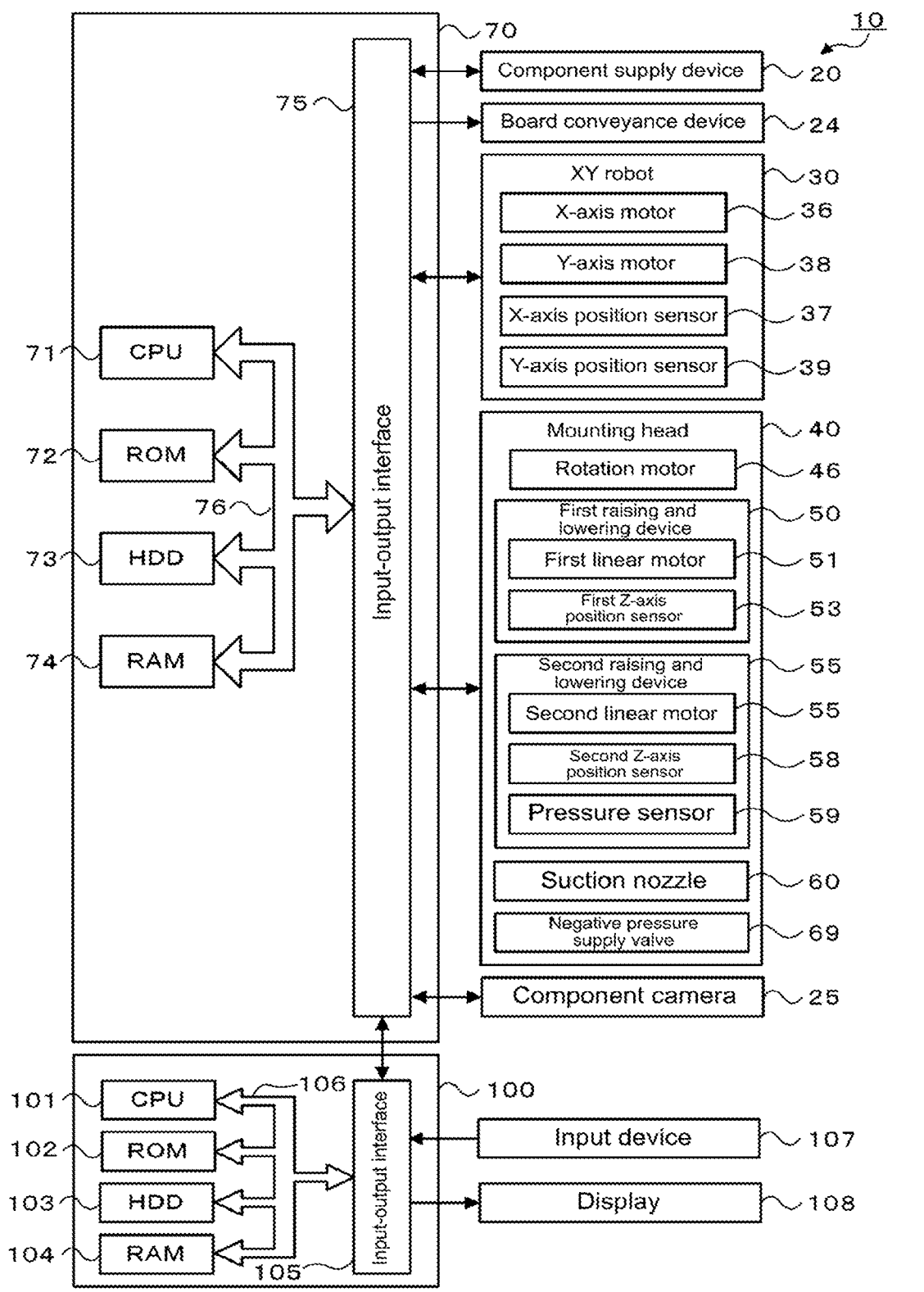
FIG. 3 is a block diagram showing the electrical connections of control device 70.

FIG. 1 shows an outline of the configuration of component mounting system 1 that includes component mounter 10 of an embodiment; FIG. 2 shows an outline of the configuration of mounting head 40; and FIG. 3 is a block diagram showing the electrical connections of control device 70. Note that, the left-right direction in FIG. 1 is the X-axis direction, the front-rear direction is the Y-axis direction, and the up-down direction is Z-axis direction.

As shown in FIG. 1, component mounting system 1 is provided with component mounter 10 and management device 100 that manages component mounter 10. Component mounting system 1 may be provided with multiple component mounters 10, and may be provided with equipment other than component mounter 10 such as a solder printer, an inspection machine, and a reflow oven.

As shown in FIG. 1, component mounter 10 is provided with component supply device 20 that supplies components P to a component supply position, board conveyance device 24 that conveys board S, mounting head 40 that picks up (collects) a component P supplied to the component supply position and mounts the component on board S, XY robot 30 that moves mounting head 40 in the XY axis directions, and control device 70 (refer to FIG. 3) that performs overall device control. Board conveyance device 24 is provided on base 11 and component supply device 20 is removably provided on base 11. Component mounter 10 is also provided with component camera 25 for imaging from below a component P held by suction nozzle 60, a mark camera (not shown) attached to mounting head 40 for imaging from above positioning reference marks provided on board S, and a side view camera (not shown) attached to mounting head 40 for imaging from the side suction nozzle 60 and a component P held by suction nozzle 60. Further, component mounter 10 is provided with items such as nozzle stocker 26 for stocking multiple nozzles, reject box 27 into which components P are discarded when a pickup error or mounting error errors, and cleaning brush 28 for cleaning suction nozzle 60. Component camera 25, nozzle stocker 26, reject box 27, and cleaning brush 28 are provided on base 11.

Component supply device 20 is configured from tape feeders that supply components P to a component supply device by pitch feeding, from a reel, tape that houses components P in storage sections formed at regular intervals.

As shown in FIG. 1, XY robot 30 is provided with Y-axis guide rail 33 attached to an upper level of housing 12 extending in the front-rear direction (Y direction), Y-axis slider 34 that is able to slide along Y-axis guide rail 33 while being supported on Y-axis guide rail 33, X-axis guide rail 31 attached to a side surface of Y-axis slider 34 extending in the left-right direction (X direction), and X-axis slider 32 that is able to slide along X-axis guide rail 31. X-axis slider 32 is movable by the driving of X-axis motor 36 (refer to FIG. 3), and Y-axis slider 34 is movable by the driving of Y-axis motor 38 (refer to FIG. 3). Mounting head 40 is provided on X-axis slider 32, and control device 70 moves mounting head 40 to any position in an XY plane by performing drive control of XY robot 30 (X-axis motor 36 and Y-axis motor 38).

As shown in FIG. 2, mounting head 40 is provided with: head main body 41; suction nozzle 60; nozzle holder 42 provided to be movable in an up-down direction (Z-axis direction) with respect to head main body 41 and to which suction nozzle 60 is removable attached; rotation device 45 that rotates nozzle holder 42; first raising and lowering device 50 that raises and lowers first Z-axis slider 52 in a Z-axis direction with respect to head main body 41; and second raising and lowering device 55 provided on first Z-axis slider 52 and that raises and lowers suction 60 nozzle relatively in the Z-axis direction with respect to first Z-axis slider 52.

Suction nozzle 60 is attached to be movable in an up-down direction (Z-axis direction) with respect to nozzle holder 42. A compression spring, not shown, is built into nozzle holder 42 and suction nozzle 60 is biased upwards with respect to nozzle holder 42 by the biasing force of the compression spring. Suction nozzle 60 is provided with suction section 61 that is capable of picking up component P by negative pressure being applied to a suction opening at the end of suction section 61 and the suction opening contacting against component P, and flange section 62 extending in a diameter direction at an upper section of suction section 61. Suction section 61 is connected to a negative pressure source, which is not shown, via negative pressure supply valve 69 (refer to FIG. 3), and by turning on negative pressure supply valve 69, negative pressure at the suction opening of suction section 61 is used to pick up component P, and, by turning off negative pressure supply valve 69, positive pressure at the suction opening of suction section 61 is used to release component P.

Rotation device 45 is provided with rotation motor 46 a rotating shaft of which is provided with gear 47. Gear 43 that engages with gear 47 is attached to an upper end of nozzle holder 42, and by control device 70 performing drive control of rotation motor 46, nozzle holder 42 can be adjusted to any rotation angle. As described above, because suction nozzle 60 is attached to an end of nozzle holder 42, by control device 70 adjusting the rotation angle of nozzle holder 42, the rotation angle of component P held by suction nozzle 60 can be adjusted.

As shown in FIG. 2, first raising and lowering device 50 is provided with first linear motor 51, and first Z-axis slider 52 that can be raised and lowered in the Z-axis direction by the driving of first linear motor 51. First engaging section 52a that can engage with (contact) horizontal section 44 provided on nozzle holder 42 is formed on first Z-axis slider 52. Therefore, nozzle holder 42 can be raised and lowered in accordance with the raising and lowering of first Z-axis slider 52. Because suction nozzle 60 is attached to nozzle holder 42, suction nozzle 60 can be raised and lowered in accordance with the raising and lowering of nozzle holder 42.

As shown in FIG. 2, second raising and lowering device 55 is provided with second linear motor 56 attached to first Z-axis slider 52 of first raising and lowering device 50, and second Z-axis slider 57 that can be raised and lowered by the driving of second linear motor 56. Second engaging section 57a that can engage with (contact) an upper surface of flange section 62 of suction nozzle 60 is formed on second Z-axis slider 57. Therefore, suction nozzle 60 can be raised and lowered in accordance with the raising and lowering of second Z-axis slider 57. In the present embodiment, the stroke distance of second Z-axis slider 57 by second raising and lowering device 55 is shorter than the stroke distance of first Z-axis slider 52 by first raising and lowering device 50. Mounting head 40, after rough adjustment of the Z-axis position of component P held by suction nozzle 60 by first raising and lowering device 50, can perform fine adjustment of the Z-axis position of component P using second raising and lowering device 55. Also, pressure sensor 59 for detecting load F applied to suction nozzle 60 when component P contacts suction section 61 of suction nozzle 60 during pickup and when component P held by suction nozzle 60 contacts board S during mounting is provided on second Z-axis slider 57.

As shown in FIG. 3, control device 70 is provided with CPU 71, ROM 72, HDD 73, RAM 74, and input-output interface 75. These items are electrically connected by bus 76. Image signals from component camera 25, image signals from the mark camera, load F from pressure sensor 59, detection signals from X-axis position sensor 37 for detecting the position of X-axis slider 32 in the X-axis direction, detection signals of Y-axis position sensor 39 for detecting the position of Y-axis slider 34 in the Y-axis direction, detection signals of first Z-axis position sensor 53 for detecting the position of first Z-axis slider 52 in the Z-axis direction, detection signals of second Z-axis position sensor 58 for detecting the position of second Z-axis slider 57 in the Z-axis direction, and so on enter control device 70 via input-output interface 75. On the other hand, control signals for component supply device 20, control signals for board conveyance device 24, drive signals for XY robot 30 (X-axis motor 36 and Y-axis motor 38), drive signals for mounting head 40 (rotation motor 46, first linear motor 51, second linear motor 56, negative pressure supply valve 69, and so on), and so on are output from control device 70 via an output port. Also, control device 70 is connected to management device 100 such that two-way communication is possible, and they perform communication of data and control signals with each other.

Management device 100, for example, is a general purpose computer provided with, as shown in FIG. 3, items such as CPU 101, ROM 102, HDD 103, RAM 104, and input-output interface 105. These items are electrically connected by bus 106. Management computer 100 receives input signals from input device 107 such as a mouse or keyboard via input-output interface 105. Also, management device 100 outputs image signals to display 108 via input-output interface 105. The HDD 103 stores a production program for the board S. Here, production program of board S defines which components P should be mounted on the board S and in what order by component mounter 10, along with how many boards S mounted with components P in this manner are to be manufactured, and so on.

Next, operation of the embodiment of component mounter 10 configured as above is described. Here, examples of operations performed by component mounter 10 are pickup operation, mounting operation, discarding operation, and cleaning operation. Pickup operation is performed by performing drive control of XY robot 30 (X-axis motor 36 and Y-axis motor 38) such that suction nozzle 60 is moved directly above the component P to be picked up supplied by component supply device 20, then performing drive control of the raising and lowering devices (first raising and lowering device 50 and second raising and lowering device 55) to lower the suction nozzle 60 until the suction nozzle 60 contacts the component P and turning on negative pressure supply valve 69 so as to pick up the component P. Mounting operation is performed by performing drive control of XY robot 30 (X-axis motor 36 and Y-axis motor 38) such that the component P held by the suction nozzle 60 is moved directly above a target mounting position on board S, then performing drive control of the raising and lowering devices to lower the suction nozzle 60 until the component P held by the suction nozzle 60 contacts the board S and turning off negative pressure supply valve 69 so as to release the component P. Discarding operation is performed in a case in which a pickup error or mounting error occurs for a component P held by suction nozzle 60. Determination of a pickup error may be performed, for example, after performing pickup operation by imaging the component P held by suction nozzle 60 using component camera 25, processing the captured image, and determining the pickup orientation of the component P. Determination of a mounting error may be performed, for example, after performing mounting operation by imaging suction nozzle 60 from the side using the side view camera, processing the captured image, and determining whether the component P is still held by the suction nozzle 60 (remaining-on-nozzle error). Discarding operation is performed by performing drive control of XY robot 30 (X-axis motor 36 and Y-axis motor 38) such that the component P held by the suction nozzle 60 is moved directly above reject box 27, then performing drive control of the raising and lowering devices to lower the suction nozzle 60 to a specified reject position and turning off negative pressure supply valve 69 so as to release the component P. Cleaning operation is performed every time a specified time period has elapsed and during free time in which pickup operation, mounting operation, and discarding operation are not being performed. Cleaning operation is performed by performing drive control of XY robot 30 (X-axis motor 36 and Y-axis motor 38) such that suction nozzle 60 is moved directly above cleaning brush 28, then performing drive control of the raising and lowering devices to lower the suction nozzle 60 to a specified cleaning position and performing drive control of rotation device 45 so as to rotate suction nozzle 60.

Figure 4:
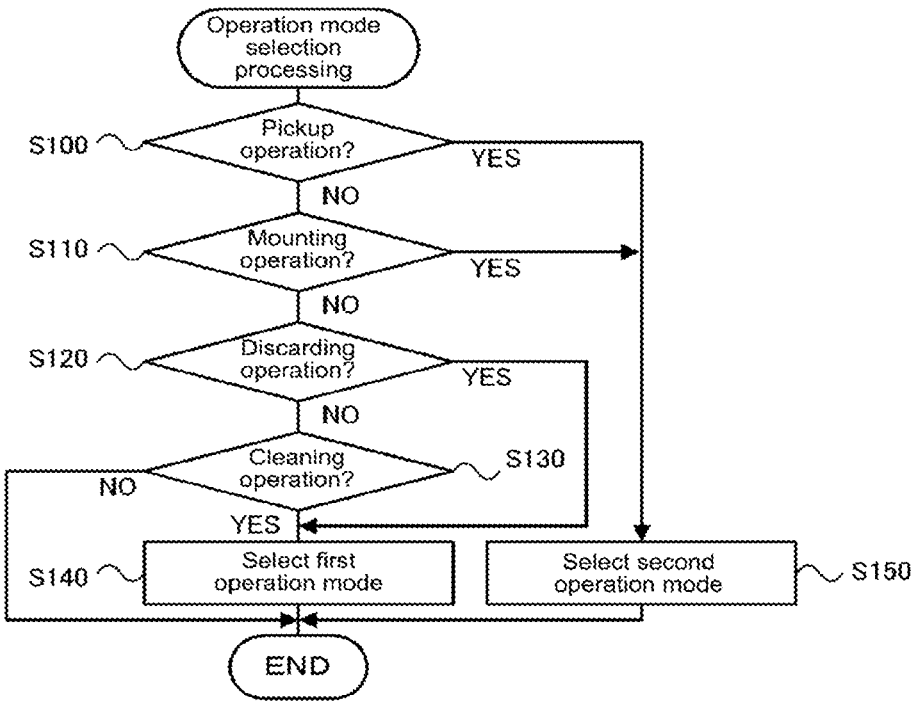
FIG. 4 is a flowchart showing an example of operation mode selection processing.

Described next is processing for selecting the operation mode when lowering suction nozzle 60 by the raising and lowering devices (first raising and lowering device 50 and second raising and lowering device 55) during performing of pickup operation, mounting operation, discarding operation, and cleaning operation. FIG. 4 is a flowchart showing an example of operation mode selection processing that is performed by CPU 71 of control device 70. When operation mode selection processing is performed, CPU 71 of control device 70, first, determines the operation to be performed is pickup operation (step S100), mounting operation (step S110), discarding operation (step S120), or cleaning operation (step S130). CPU 71, upon determining that the operation to be performed is discarding operation or cleaning operation, selects the first operation mode as the operation mode (step S140), then ends operation mode selection processing. On the other hand, CPU 71, upon determining that the operation to be performed is pickup operation or mounting operation, selects the second operation mode as the operation mode (step S150), then ends operation mode selection processing.

Figure 5:
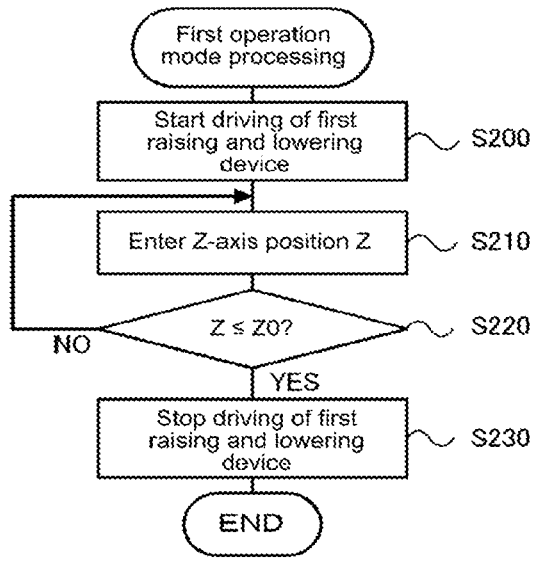
FIG. 5 is a flowchart showing an example of first operation mode execution processing.

Here, the first operation mode is performed by performing the first operation mode execution processing of FIG. 5. In the first operation mode execution processing, CPU 71 of control device 70, first, starts driving of first raising and lowering device 50 (first linear motor 51) to lower suction nozzle 60 (step S200). Next, CPU 71, while driving first raising and lowering device 50, enters a Z-axis position of the tip of suction nozzle 60 identified based on detection signals from first Z-axis position sensor 53 and second Z-axis position sensor 58 (step S210), and determines whether the entered Z-axis position Z has reached target position Z0 (step S220). Here, target position Z0 is a reject position in a case of performing discarding operation as first operation mode execution processing, and is a cleaning position in a case of performing cleaning operation as first operation mode execution processing. CPU 71, upon determining that the Z-axis position Z has not reached the target position Z0, returns to step S210 and repeats processing of steps S210 and S220, but upon determining that the Z-axis position Z has reached the target position Z0, stops driving first raising and lowering device 50 (first linear motor 51) (step S230) and ends first operation mode execution processing.

Figure 6:
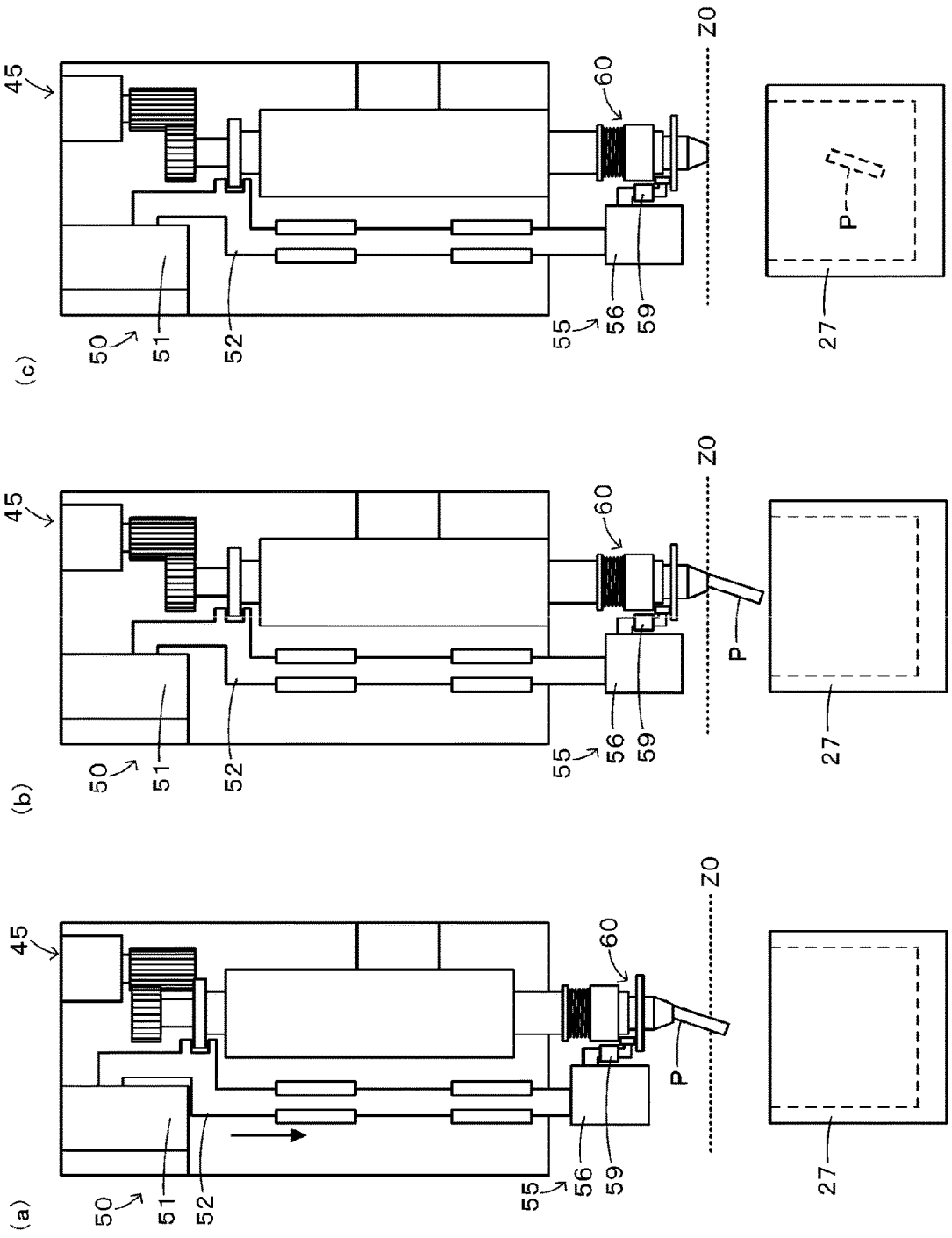
FIG. 6 illustrates a state during discarding operation.

FIG. 6 illustrates a state during discarding operation. CPU 71, when performing discarding operation, after moving suction nozzle 60 for which a pickup error or mounting error occurred (in the example of the figure, a tombstone pickup has occurred in which component P has been picked up in an upright posture) directly above reject box 27, drives first linear motor 51 to lower first Z-axis slider 52 so as to lower suction nozzle 60 (refer to 6[a]). Then, CPU 71, when the tip of the suction nozzle 60 has reached the target position Z0 (target reject position) (refer to FIG. 6[b]), stops driving first linear motor 51, turns off negative pressure supply valve 69 to release the holding of the component P by the suction nozzle 60 so as to reject the component P into reject box 27 (refer to FIG. 6[c]).

Figure 7:
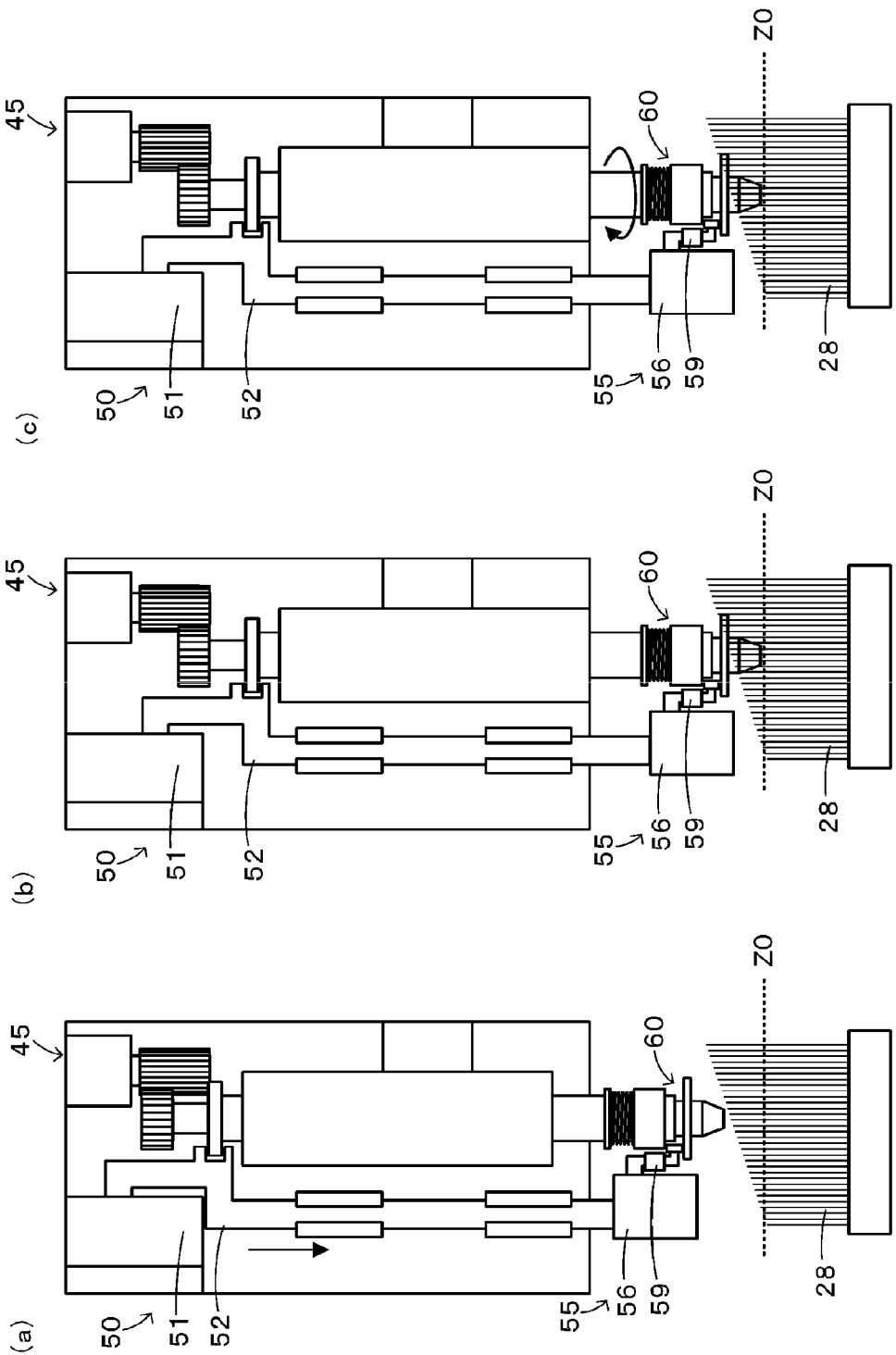
FIG. 7 illustrates a state during cleaning operation.

FIG. 7 illustrates a state during cleaning operation. CPU 71 of control device 70, when performing cleaning operation, after moving suction nozzle 60 directly above cleaning brush 28, drives first linear motor 51 to lower first Z-axis slider 52 so as to lower suction nozzle 60 (refer to FIG. 7[a]). Then, CPU 71, when the tip of the suction nozzle 60 has reached the target position Z0 (refer to FIG. 76[b]), stops driving first linear motor 51, and drives rotation motor 46 to rotate nozzle holder 42 such that suction nozzle 60 rotates so as to clean the suction opening of the suction nozzle 60 (refer to FIG. 7[c]).

Figure 8:
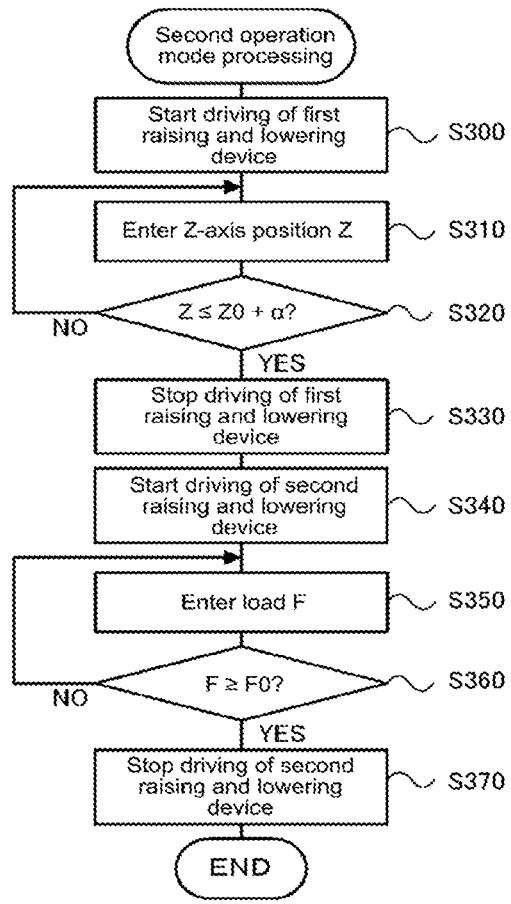
FIG. 8 is a flowchart showing an example of second operation mode execution processing.

Here, the second operation mode is performed by performing the second operation mode execution processing of FIG. 8. In the second operation mode execution processing, CPU 71 of control device 70, first, starts driving of first raising and lowering device 50 (first linear motor 51) to lower suction nozzle 60 (step S300). Then, CPU 71 receives the Z-axis position Z of the tip of suction nozzle 60 identified based on detection signals of first Z-axis position sensor 53 and second Z-axis position sensor 58 (S310), and determines whether the received Z-axis position Z has reached a specified position (Z0+α) that is distance α above the target position Z0 (step S320). Here, target position Z0, when performing pickup operation, is a position on the upper surface of component P supplied by the component supply device, and when performing mounting operation, is a position on the upper surface of board S on which mounting is to be performed. CPU 71, upon determining that the Z-axis position Z has not reached the specified position (Z0+α), returns to step S310 and repeats processing of steps S310 and S320, but upon determining that the Z-axis position Z has reached the specified position (Z0+α), stops driving first raising and lowering device 50 (first linear motor 51) (step S330) and starts driving second raising and lowering device 55 (second linear motor 56) such that second Z-axis slider 57 is lowered relatively with respect to first Z-axis slider 52 (step S340). Next, CPU 71 receives load F applied to suction nozzle 60 from pressure sensor 59 (step S350) and determines whether the received load F has reached target load F0 (step S360). CPU 71, upon determining that load F has not reached target load F0, returns to step S350, but upon determining that load F has reached target load F0, stops driving of second raising and lowering device 55 (second linear motor 56) (step S370), and ends second operation mode execution processing.

Figure 9:
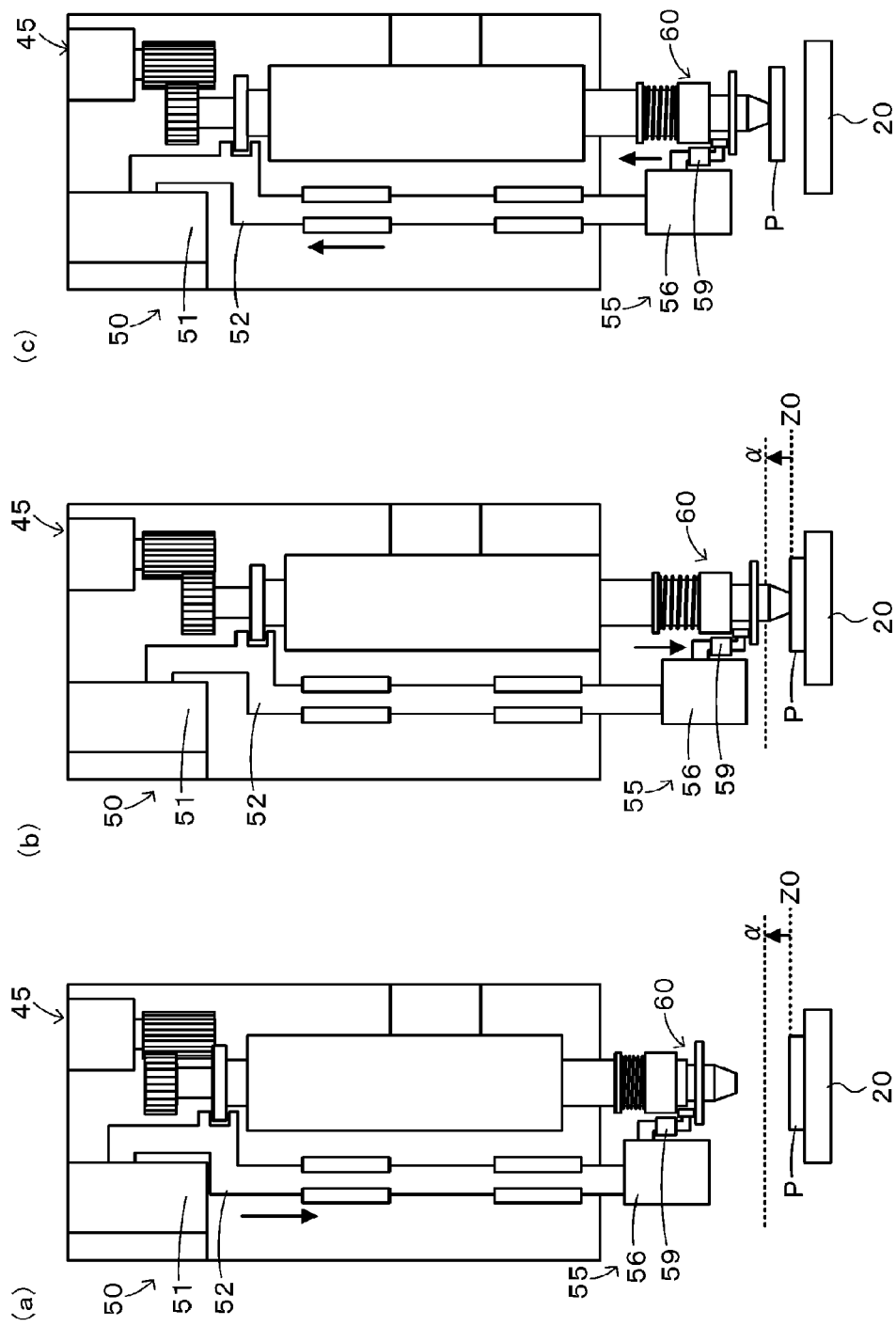
FIG. 9 illustrates a state during pickup operation.

FIG. 9 illustrates a state during pickup operation. CPU 71 of control device 70, when performing pickup operation, after moving suction nozzle 60 directly above the component P to be picked up that is supplied by component supply device 20, drives first linear motor 51 to lower first Z-axis slider 52 so as to lower suction nozzle 60 (refer to FIG. 9[a]). Then, CPU 71, when the tip of the suction nozzle 60 has reached the specified position that is specified distance α above target position Z0 (Z0+α), stops driving first linear motor 51, and drives second linear motor 56 such that suction nozzle 60 is lowered even further at low speed (refer to FIG. 9[b]). This softens the impact when suction nozzle 60 contacts component P. Then, CPU 71, when suction nozzle 60 contacts component P, pushes the tip of suction nozzle 60 against component P until load F from pressure sensor 59 reaches target load F0 and picks up component P using suction nozzle 60, then drives first linear motor 51 and second linear motor 56 to raise suction nozzle 60 (refer to FIG. 9[c]).

Figure 10:
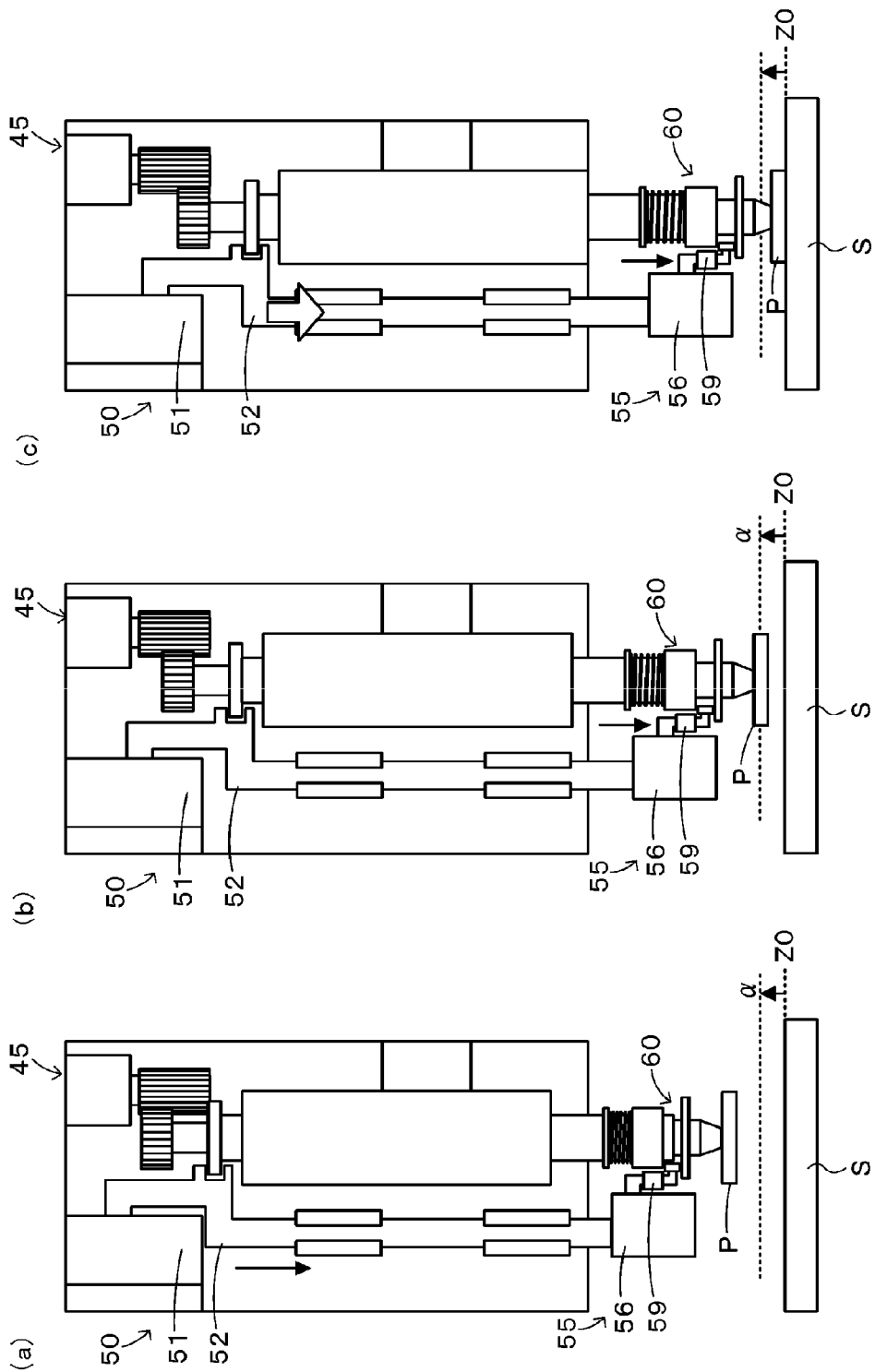
FIG. 10 illustrates a state during mounting operation.

FIG. 10 illustrates a state during mounting operation. CPU 71 of control device 70, when performing mounting operation, after moving component P held by suction nozzle 60 directly above the mounting position of board S, drives first linear motor 51 to lower first Z-axis slider 52 so as to lower suction nozzle 60 (refer to FIG. 10[a]). Then, CPU 71, when the tip of the suction nozzle 60 has reached the specified position that is specified distance α above target position Z0 (Z0+α), stops driving first linear motor 51, and drives second linear motor 56 such that suction nozzle is lowered even further at low speed (refer to FIG. 10[b]). This softens the impact when component P contacts board S. Also, CPU 71, when component P held by suction nozzle 60 contacts board S, pushes the component P against board S until load F from pressure sensor 59 reaches target load F0, then releases component P from suction nozzle 60 (FIG. 10[c]).

Correspondences between main constituent elements of the embodiments and main constituent elements of the disclosure will be clarified here. Mounting head 40 corresponds to a "head", suction nozzle 60 corresponds to a "holding member", first raising and lowering device 50 corresponds to a "first raising and lowering device", second raising and lowering device 55 corresponds to a "second raising and lowering device", and control device 70 corresponds to a "control device". Also, pressure sensor 59 corresponds to a "load measuring section".

Component mounter 10 of an embodiment described above is provided with first raising and lowering device 50 that raises and lowers first Z-axis slider 52, and second raising and lowering device 55 provided on first Z-axis slider 52 and that raises and lowers suction nozzle 60 relatively in the Z-axis direction with respect to first Z-axis slider 52. Also, component mounter 10 selectively performs a first operation mode of driving first raising and lowering device 50 to lower suction nozzle 60, and a second operation mode of driving first raising and lowering device 50 and second raising and lowering device 55 to lower suction nozzle 60. Thus, with component mounter 10, by appropriately using either the first operation mode or the second operation mode for multiple types of operations in accordance with the lowering of suction nozzle 60, it is possible to appropriately perform the multiple types of operations.

Also, component mounter 10 of an embodiment is provided with pressure sensor 59 on second raising and lowering device 55 for detecting a load applied to suction nozzle 60, and performs a discarding operation and a cleaning operation, which do not require control of the load, via the first operation mode, and performs a pickup operation and a mounting operation, which require control of the load, via the second operation mode. Thus, component mounter 10 is able to perform the pickup operation and the mounting operation, which require control of the load, with high accuracy, and is able to perform the discarding operation and the cleaning operation, which do not require control of the load, with high speed.

Meanwhile, it goes without saying that the present disclosure is not limited to the above-mentioned embodiment and various embodiments may be applied within the technical scope of the present disclosure.

For example, in an embodiment above, the pickup operation and the mounting operation are performed via the second operation mode, but switching may occur between the first operation mode and the second operation mode in accordance with the size or shape of component P. For example, for a component with a thickness larger than a specified value (a component that can withstand shock relatively well), the first operation mode may be used when performing pickup operation and mounting operation, while for a component with a thickness smaller than a specified value (a component that cannot withstand shock well), the second operation mode may be used when performing pickup operation and mounting operation.

Figure 11:
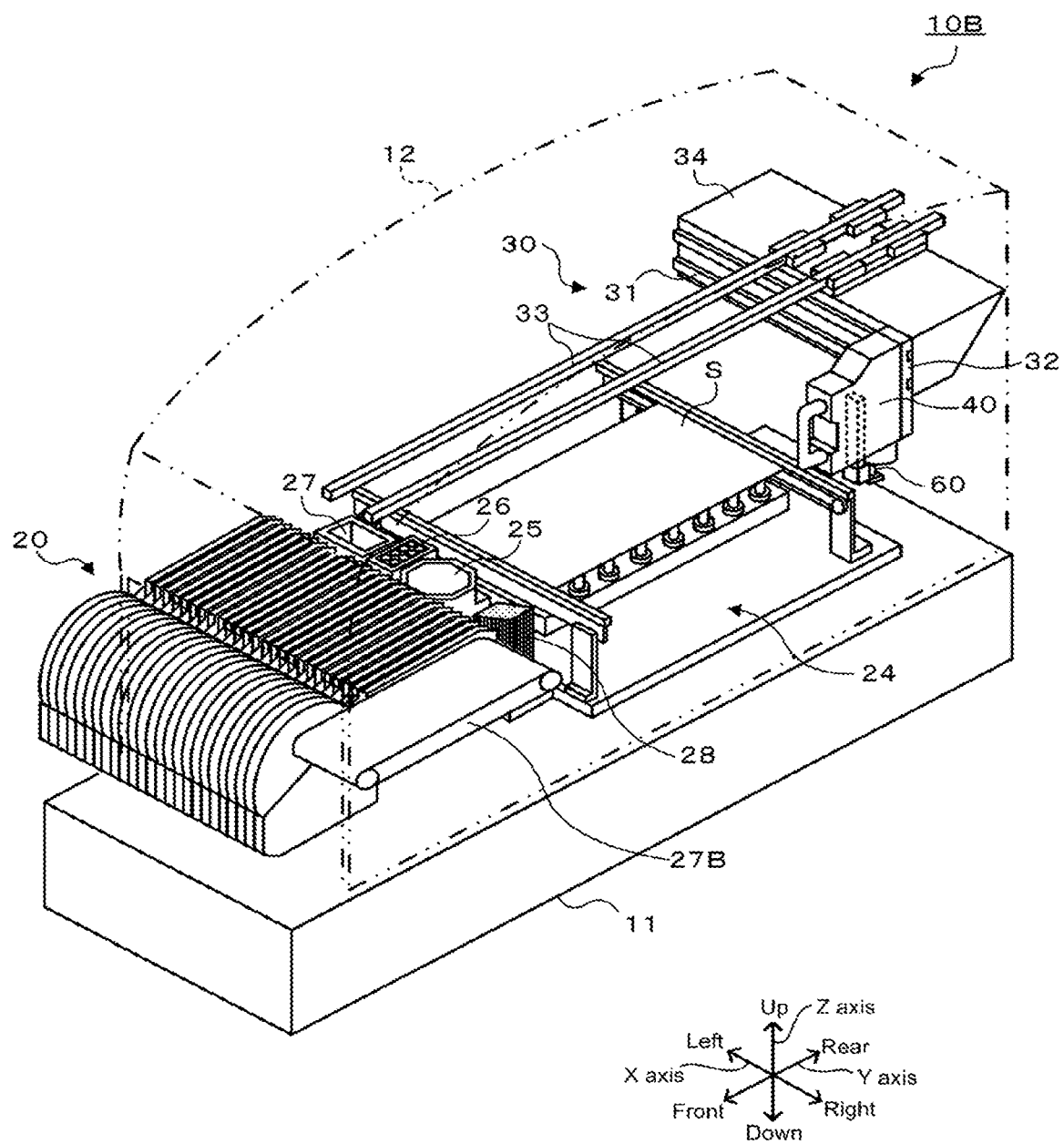
FIG. 11 shows an outline of a configuration of a component mounting line 10B of an alternative embodiment.

Also, in an embodiment above, component mounter 10 performs discarding operation via the first operation mode, but the first operation mode and the second operation mode may be selected in accordance with the type of component to be discarded. FIG. 11 shows an outline of a configuration of a component mounting line 10B of an alternative embodiment. Alternative embodiment component mounter 10B differs from component mounter 10 of an earlier embodiment in that the reject location for discarding a component P for which an error occurred is component loading section 27B instead of reject box 27. Component loading section 27B is provided next to component supply device 20 on base 11. Component loading section 27B is provided with a conveyor and error components can be loaded on the conveyor. The conveyor is provided on a pair of pulleys supported on base 11 and is moved by the pulleys being driven by a motor. A loading area onto which the error components are loaded is set on the conveyor. Component loading section 27B, when an error component is loaded in the loading area, moves the conveyor by a specified amount such that an open space for the next error component can be maintained. Instead of a conveyor, component loading section 27B may be provided with a stage with a flat loading surface.

Figure 12:
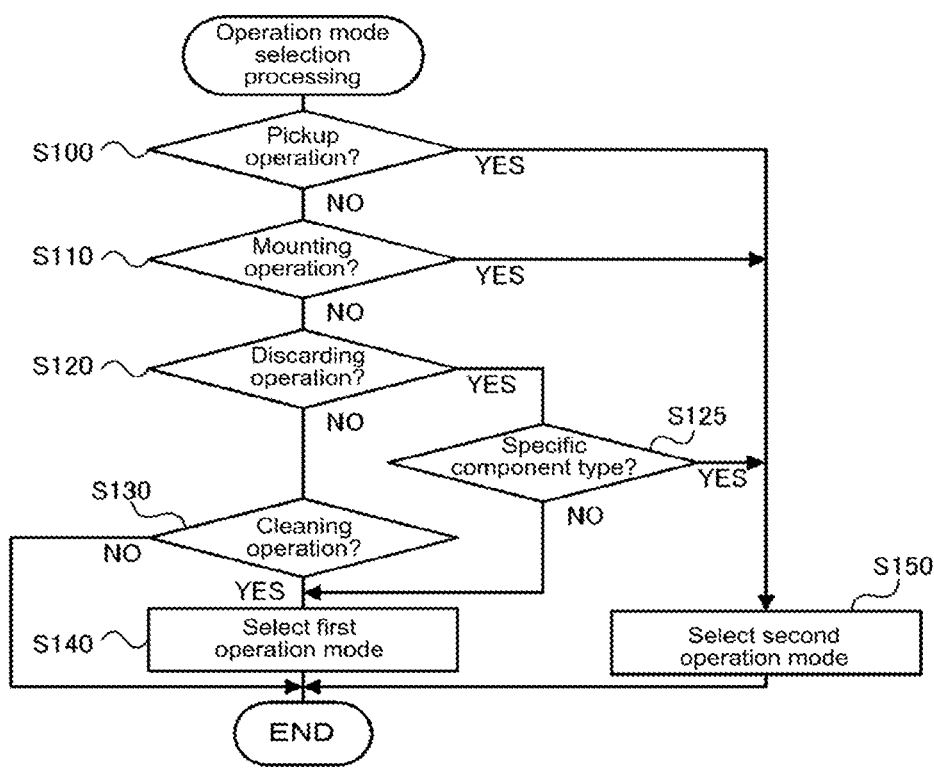
FIG. 12 shows an alternative example of operation mode selection processing.

Described next is operation mode selection processing for the alternative embodiment component mounter 10B configured as described above. FIG. 12 shows an alternative example of operation mode selection processing. Note that, for processing of the operation mode selection processing of FIG. 12 that is the same as the processing of the operation mode selection processing of FIG. 4, steps have the same reference numbers and descriptions are omitted. With the operation mode selection processing of FIG. 12, CPU 71, if determining in step S120 that the operation to be performed is discarding processing, determines whether the component type of the component P held by suction nozzle 60 is a specific component type (step S125). Here, a specified component type is, for example, a component type that may be used again such as an expensive component or a leaded component. CPU 71, if determining that the component type is not a specific component type, selects the first operation mode as the operation mode for discarding processing (step S140). Component mounter 10B, when discarding a component P for which there is no possibility of being used again, similar to component mounter 10 of an earlier embodiment, performs drive control of first raising and lowering device 50 via the first operation mode so as to discard the component P held by suction nozzle 60 into reject box 27. On the other hand, CPU 71, if determining that the component type is a specific component type, selects the second operation mode as the operation mode for discarding processing (step S150). Component mounter 10B, when discarding a component P for which there is a possibility of being used again, performs drive control of first raising and lowering device 50 and second raising and lowering device 55 via the second operation mode so as to load the component P held by suction nozzle 60 on component loading section 27B. That is, CPU 71 performs drive control of XY robot 30 to move the component P held by suction nozzle 60 above the loading area of component loading section 27B, and performs drive control of first raising and lowering device 50 (first linear motor 51) to lower suction nozzle 60 at high speed. Then, CPU 71, when suction nozzle 60 has reached a specified position that is a specified distance above the loading surface of component loading section 27B, stops driving first raising and lowering device 50 (first linear motor 51), and drives second raising and lowering device 55 (second linear motor 56) such that suction nozzle 60 is lowered even further at low speed. Then, CPU 71, when the component P contacts the loading area of component loading section 27B, releases the component P from suction nozzle 60. Thus, it is possible to effectively curtail damage caused by receiving an excessive load when loading a component that may be used again on component loading section 27B.

Also, in an embodiment above, component mounter 10, as examples, performs discarding operation and cleaning operation as operations that use the first operation mode, but such operations are not limited to these, for example, a calibration operation for measuring a position of suction nozzle 60 after contacting the suction nozzle 60 against a calibration plate provided at a reference height may be performed using the first operation mode.

Further, in an embodiment above, cleaning brush 28 is provided on base 11, but the configuration is not limited to this, one of the multiple tape feeders of component supply device 20 may be replaced by a cleaning member provided with a cleaning brush.

Also, in an embodiment above, CPU 71, when lowering suction nozzle 60 by driving second linear motor 56 using the second operation mode, stops driving of first linear motor 51 and then starts driving of second linear motor 56, but the driving of second linear motor 56 may be started while first linear motor 51 is still being driven.

Further, in an embodiment above, the load applied on suction nozzle 60 is detected using pressure sensor 59 provided on second Z-axis slider 57, but the load applied on suction nozzle 60 may be measured by detecting or estimating the electrical current load on second linear motor 56.

Also, in an embodiment above, first linear motor 51 is used as an actuator for first raising and lowering device 50, but a voice coil motor, ball screw mechanism, or the like may be used. Also, in an embodiment above, second linear motor 56 is used as an actuator for second raising and lowering device 55, but a voice coil motor or the like may be used.

INDUSTRIAL APPLICABILITY

The present disclosure may be applied to the industrial field of component mounters and the like.

REFERENCE SIGNS LIST

1: component mounting system;
10, 10B: component mounter;
11: base;
12: housing;
20: component supply device;
24: board conveyance device;
25: component camera;
26: nozzle stocker;
27: reject box;
27B: component loading section;
28: cleaning brush;
30 XY robot;
31 X-axis guide rail;
32 X-axis slider;
33 Y-axis guide rail;
34 Y-axis slider;
36 X-axis motor;
37 X-axis position sensor;
38 Y-axis motor;
39 Y-axis position sensor;
40: mounting head;
41: head main body;
42: nozzle holder;
43: gear;
44: horizontal section;
45: rotation device;
46: rotation motor;
47: gear;
50: first raising and lowering device;
51: first linear motor;
52: first Z-axis slider;
52a: first engaging section;
53: first Z-axis position sensor;
55: second raising and lowering device;
56: second linear motor;
57: second Z-axis slider;
57a: second engaging section;
58: second Z-axis position sensor;
59: pressure sensor;
60: suction nozzle;
61: pickup section;
62: flange section;
69: negative pressure supply valve;
70: control device;
71: CPU;
72: ROM;
73: HDD;
74: RAM;
75: input-output interface;
76: bus;
100: management device;
101: CPU;
102: ROM;
103: HDD;
104: RAM;
105: input-output interface;
106: bus;
107: input device;
108: display;
P: component;
S: board

The invention claimed is:

1. A component mounter for picking up a component supplied by a component supply device and mounting the component on a target object, the component mounter comprising:
a head provided on X-axis slider;
a holding member configured to hold a component, wherein the holding member is a nozzle;
a first raising and lowering device comprising a first vertically movable slider, configured to raise and lower a raising and lowering member with respect to the head; a second raising and lowering device comprising a second vertically movable slider, configured to relatively raise and lower the holding member with respect to the raising and lowering member and to be raised and lowered together with the raising and lowering member by the first raising and lowering device; and
a control device configured to selectively perform a first operation mode of driving the first raising and lowering device to lower the holding member, and a second operation mode of driving the first raising and lowering device and the second raising and lowering device to lower the holding member, and
perform a rejection operation of rejecting a component picked up by the holding member via the first operation mode in a case in which a type of the component is a non-specified type, and
perform the rejection operation of rejecting the component picked up by the holding member via the second operation mode in a case in which the type of the component is a specified type.

2. The component mounter according to claim 1, further comprising a load measuring section provided on the second raising and lowering device and configured to measure a load applied with respect to the holding member using a sensor, wherein the control device is configured to perform an operation that does not require the load measuring section via the first operation mode, and perform an operation that requires the load measuring section via the second operation mode.

3. The component mounter according to claim 1, wherein the control device is configured to perform a cleaning operation of cleaning the holding member using a cleaning tool via the first operation mode.

4. The component mounter according to claim 1, wherein the control device is configured to perform a mounting operation of using the holding member to mount the component via the second operation mode.

5. The component mounter according to claim 1, wherein the control device is configured to perform a pickup operation of using the holding member to pick up the component via the second operation mode.

* * * * *